(12) United States Patent
Chen et al.

(10) Patent No.: US 8,519,434 B2
(45) Date of Patent: Aug. 27, 2013

(54) SELF DETECTION DEVICE FOR HIGH VOLTAGE ESD PROTECTION

(75) Inventors: Hsin-Liang Chen, Taipei (TW); Shou-Lun Tu, Hsinchu (TW); Wing-Chor Chan, Hsinchu (TW); Shyi-Yuan Wu, Hsin-Chu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 342 days.

(21) Appl. No.: 13/053,920

(22) Filed: Mar. 22, 2011

(65) Prior Publication Data
US 2012/0241900 A1 Sep. 27, 2012

(51) Int. Cl.
*H01L 23/60* (2006.01)

(52) U.S. Cl.
USPC .......................................... 257/173; 257/355

(58) Field of Classification Search
USPC ............. 257/173, 255, 545–547, E21.04, 257/E29.005, E29.029, E29.044; 438/309, 438/329; 361/56
See application file for complete search history.

(56) References Cited

U.S. PATENT DOCUMENTS

| | | | | |
|---|---|---|---|---|
| 5,541,801 A * | 7/1996 | Lee et al. | ......................... | 361/56 |
| 5,689,133 A * | 11/1997 | Li et al. | ......................... | 257/361 |
| 5,905,288 A * | 5/1999 | Ker | ................. | 257/355 |
| 5,982,217 A * | 11/1999 | Chen et al. | ..................... | 327/321 |
| 6,268,992 B1 * | 7/2001 | Lee et al. | ....................... | 361/111 |
| 6,323,523 B1 * | 11/2001 | Lee et al. | ....................... | 257/355 |
| 6,671,153 B1 * | 12/2003 | Ker et al. | ....................... | 361/111 |
| 6,784,498 B1 * | 8/2004 | Lee et al. | ....................... | 257/361 |
| 7,804,669 B2 * | 9/2010 | Worley | ........................... | 361/56 |
| 2003/0047787 A1 * | 3/2003 | Cheng et al. | .................. | 257/360 |
| 2005/0082618 A1 * | 4/2005 | Wu et al. | ....................... | 257/355 |
| 2006/0027872 A1 * | 2/2006 | Chen | ............................. | 257/355 |
| 2006/0044714 A1 * | 3/2006 | Chen | ................................. | 361/56 |
| 2007/0007545 A1 * | 1/2007 | Salcedo et al. | ................ | 257/127 |
| 2007/0052032 A1 * | 3/2007 | Huang et al. | .................. | 257/357 |
| 2008/0048266 A1 * | 2/2008 | Russ et al. | .................... | 257/355 |
| 2008/0259511 A1 * | 10/2008 | Worley | ........................... | 361/56 |
| 2009/0101937 A1 * | 4/2009 | Lee et al. | ....................... | 257/137 |
| 2009/0195951 A1 * | 8/2009 | Sorgeloos et al. | ............. | 361/56 |
| 2009/0236631 A1 * | 9/2009 | Chen et al. | .................... | 257/109 |
| 2010/0320501 A1 * | 12/2010 | Gendron et al. | ............. | 257/173 |
| 2011/0032647 A1 * | 2/2011 | Kawachi | ......................... | 361/56 |
| 2011/0110005 A1 * | 5/2011 | Benner, Jr. | ....................... | 361/56 |
| 2011/0186909 A1 * | 8/2011 | Tsai et al. | ...................... | 257/173 |

* cited by examiner

*Primary Examiner* — Hsien Ming Lee
*Assistant Examiner* — Michele Fan
(74) *Attorney, Agent, or Firm* — Alston & Bird LLP (57) ABSTRACT

An electrostatic discharge (ESD) protected device may include a substrate, an N-type well region disposed corresponding to a first portion of the substrate and having two N+ segments disposed at a surface thereof, an a P-type well region disposed proximate to a second portion of the substrate and having a P+ segment and an N+ segment. The two N+ segments may be spaced apart from each other and each may each be associated with an anode of the device. The N+ segment may be associated with a cathode of the device. A contact may be positioned in a space between the two N+ segments and connected to the P+ segment. The contact may form a parasitic capacitance that, in connection with a parasitic resistance formed in association with the N+ segment, provides self detection for high voltage ESD protection.

20 Claims, 7 Drawing Sheets

SELF DETECTION DEVICE FOR HIGH VOLTAGE ESD PROTECTION

TECHNOLOGICAL FIELD

Embodiments of the present invention generally relate to semiconductor devices and, more particularly, relate to a self detection device for high voltage electrostatic discharge (ESD) protection.

BACKGROUND

There is currently an ongoing drive toward the downscaling of device dimensions in virtually all aspects of electronic device manufacture. Smaller electronic devices tend to be more popular than larger, more bulky devices when both devices have substantially equivalent capabilities. Accordingly, being able to fabricate smaller components would clearly tend to facilitate the production of smaller devices that incorporate those components. However, many modern electronic devices require electronic circuitry to perform both actuation functions (e.g., switching devices) and data processing or other decision making functions. The use of low-voltage complementary metal-oxide-semiconductor (CMOS) technologies for these dual functions may not always be practical. Thus, high-voltage (or high-power) devices have also been developed to handle many applications where low-voltage operation is not practical.

The electrostatic discharge (ESD) performance of typical high-voltage devices often depends on the total width and surface or lateral rules of the corresponding devices. Thus, ESD performance may typically be more critical for smaller devices. High-voltage devices typically have characteristics that include a low on-state resistance (Rdson), a high breakdown voltage and a low holding voltage. The low on-state resistance may tend to make an ESD current more likely to concentrate on the surface or the drain edge of a device during an ESD event. High current and high electric fields may cause the physical destruction at a surface junction region of such a device. Based on the typical requirement for a low on-state resistance, the surface or lateral rules likely cannot be increased. Thus, ESD protection may be a challenge.

The high breakdown voltage characteristic of high-voltage devices typically means that the breakdown voltage is higher than the operating voltage, and the trigger voltage (Vt1) is higher than the breakdown voltage. Accordingly, during an ESD event, the internal circuitry of the high-voltage device may be at risk of damage before the high-voltage device turns on for ESD protection. The low holding voltage characteristic of high-voltage devices also leaves open the possibility that unwanted noise associated with a power-on peak voltage or a surge voltage may be triggered or that a latch-up may occur during normal operation. High-voltage devices may also experience the field plate effect due to the fact that electric field distribution may be sensitive to routing so that ESD current may be likely to concentrate at the surface or drain edge during an ESD event.

To improve high-voltage device performance with respect to ESD events, one technique that has been implemented involves the additional use of masks and other processes to create a larger sized diode within bipolar junction transistor (BJT) components and/or increasing the surface or lateral rules for MOS transistors. Other attempts to improve performance have included the use of external ESD detection circuits.

Accordingly, it may be desirable to develop an improved structure for providing ESD resistance.

BRIEF SUMMARY OF EXEMPLARY EMBODIMENTS

Some example embodiments are therefore directed to a self detection device for high voltage ESD protection. In some cases, the ESD protection may be provided by a self detection device that can be fabricated by a standard BCD (Bipolar Complimentary metal-oxide semiconductor (BiCMOS) Diffusion metal-oxide semiconductor (DMOS)) process. In some embodiments, the ESD protection may involve an epi process.

In one exemplary embodiment, a high-voltage electrostatic discharge (ESD) protected device is provided ("exemplary" as used herein referring to "serving as an example, instance or illustration"). The high-voltage ESD protected device may include a substrate, an N-type well region disposed corresponding to a first portion of the substrate and having two N+ segments disposed at a surface thereof, an a P-type well region disposed proximate to a second portion of the substrate and having a P+ segment and an N+ segment. The two N+ segments may be spaced apart from each other and each may each be associated with an anode of the device. The N+ segment may be associated with a cathode of the device. A contact may be positioned in a space between the two N+ segments and connected to the P+ segment. The contact may form a parasitic capacitance that, in connection with a parasitic resistance formed in association with the N+ segment, provides self detection for high voltage ESD protection.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Some example embodiments of the present invention will now be described more fully hereinafter with reference to the accompanying drawings, in which some, but not all embodiments of the invention are shown. Indeed, various example embodiments of the invention may be embodied in many different forms and should not be construed as limited to the example embodiments set forth herein; rather, these example embodiments are provided so that this disclosure will satisfy applicable legal requirements.

Some example embodiments of the present invention may provide a BCD process for providing a self detection device for high voltage ESD protection. Moreover, some example embodiments may provide for such protection without requiring additional masks or processes. Thus, for example, some embodiments may remove the need to have external ESD protection circuits.

Figure 1:
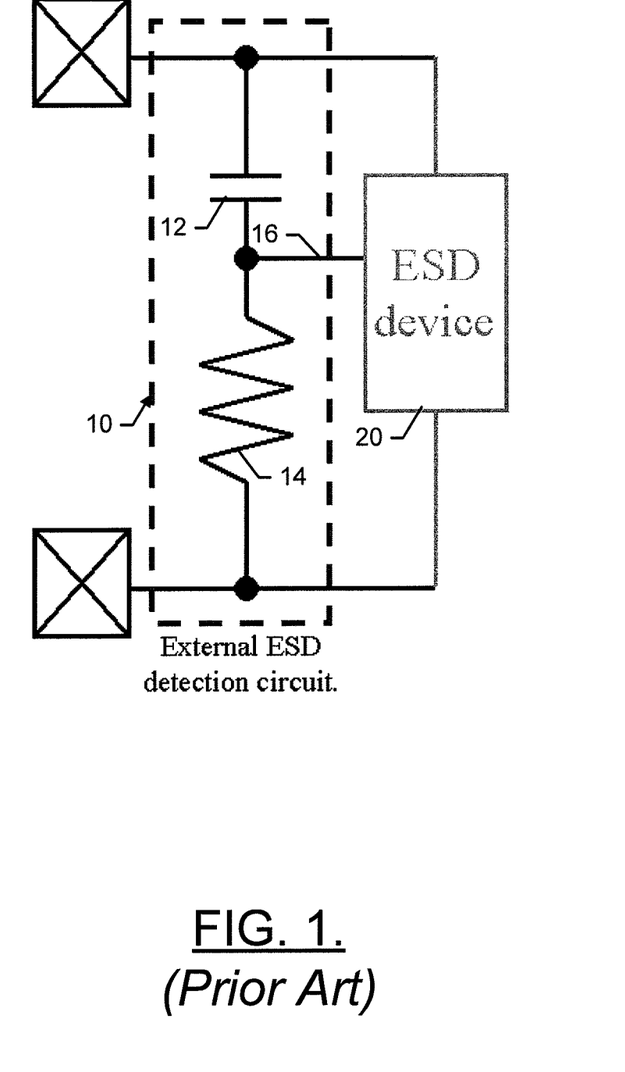
FIG. 1 illustrates a block diagram an example circuit that may be employed in a typical ESD detection structure.

FIG. 1 illustrates a block diagram an example circuit that may be employed in a typical ESD detection structure. As shown in FIG. 1, a conventional structure may employ an external ESD detection circuit 10 that is external to, but also connected to an ESD device 20 to provide ESD protection. The external ESD detection circuit may include a capacitor 12 and a resistor 14 that are connected to each other between terminals of the device to be protected (e.g., between the anode and cathode of the protected device). As can be seen in FIG. 1, the external ESD detection circuit 10 provides a triggering input terminal 16 to the ESD device 20 to trigger ESD protection. Thus, to provide the structure of FIG. 1, external components must be employed in order to establish the triggering input terminal 16 to trigger the ESD device 20.

Figure 2:
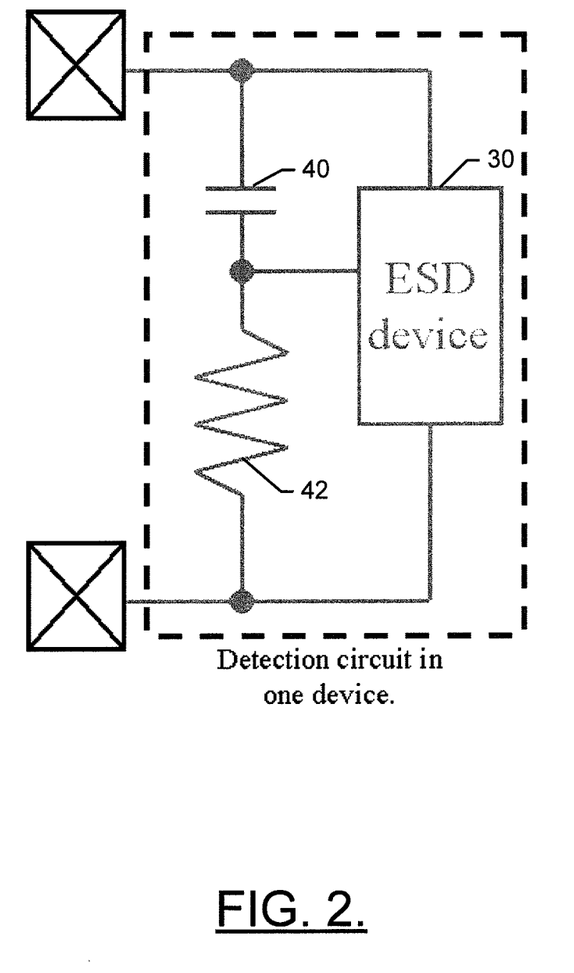
FIG. 2 illustrates a block diagram of an example circuit that may be employed to provide ESD protection without requiring external components according to an exemplary embodiment.

To avoid the use of an external structure, some example embodiments may employ the structure shown in FIG. 2. FIG. 2 illustrates a block diagram of an example circuit that may be employed to provide ESD protection without requiring external components. As such, FIG. 2 illustrates a self detection device for high voltage ESD protection. The self detection structure of FIG. 2 may also be employed between terminals (e.g., anode and cathode) of a device to be protected, but may provide for a detection circuit within one device. As shown in FIG. 2, an ESD device 30 may be provided in connection with a parasitic capacitor 40 and a parasitic resistor 42. The ESD device 30 may further include a bipolar junction transistor (BJT) such as an NPN BJT to form a protection circuit that does not require external components. Thus, for example, there is no need for an external input terminal to trigger the ESD device 30. Instead, the ESD device 30 is triggered entirely by the function of internal components (in this case the parasitic capacitor 40 and the parasitic resistor 42 that set up the triggering of operation of the ESD device 30. Accordingly, the metal wiring used to fabricate a high voltage switching device may be reduced and ESD device layout area may also be reduced. Moreover, some example embodiments may end up being relatively insensitive to routing issues and may not suffer from field plate effect. Example embodiments may also have a total area that may be less than the use of a diode in connection with a BJT or metal oxide semiconductor (MOS) having the same ESD performance characteristics.

In this regard, some example embodiments may provide for a relatively small-sized, structure for high voltage ESD protection. Moreover, some example embodiments may provide such a structure to be contained within a self detection device rather than relying upon external components. Thus, high voltage ESD protection can be provided for high voltage devices in circuits. However, some embodiments may also be useful for low voltage applications. In this regard, for example, noise induced power-on peak voltages and surge voltages may also be detected during general DC circuit operation without external components. Example embodiments may also have a breakdown voltage that is near the high-voltage device operation voltage and a trigger voltage that is lower than the high-voltage device breakdown voltage. Furthermore, a relatively high holding voltage may be provided to more easily avoid latch-up occurrence than with a silicon controlled rectifier (SCR). Example embodiments may be provided, in some cases, with a standard BCD process that does not require the addition of an increased number of masks or processes.

Figure 3:
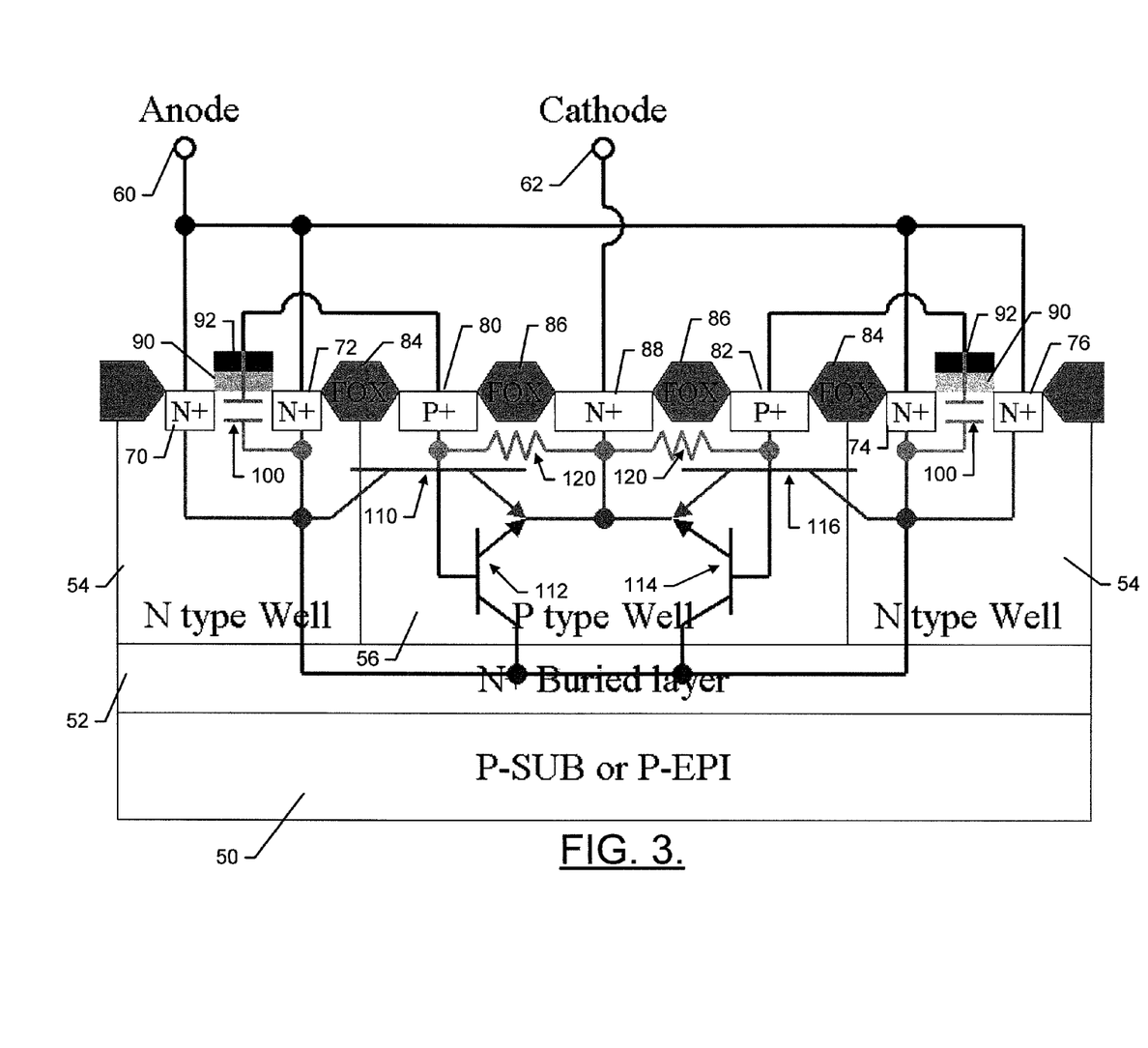
FIG. 3 illustrates a cross-sectional view of the structure of an exemplary embodiment for providing high-voltage ESD protection using a self detection ESD device.

FIG. 3 illustrates a cross-sectional view of the structure of an example embodiment for providing high-voltage ESD protection using a self detection ESD device. As can be seen from FIG. 3, a P-type material substrate 50 or an epitaxially-grown P-layer (P-epi) may be provided with a N+ buried layer 52 disposed thereon. An N-type well 54 may be disposed over outer edges to surround a P-type well 56. The anode 60 of the device may be associated with the N-type wells 54 via corresponding N+ segments 70, 72, 74 and 76. In an example embodiment, each of the N-type wells 54 may have two respective N+ segments (e.g., N+ segments 70 and 72 and N+ segments 74 and 76). The N+ segments may be separated from respective P+ segments 80 and 82 by field-oxide films (FOX) 84, which may correspond to the border between the N-type wells 54 and the P-type well 56. Another set of FOX components (e.g., FOX 86) may be positioned at a surface of the device to separate the P+ segments 80 and 82 from an N+ segment 88 that corresponds to a cathode 62 of the device.

As shown in FIG. 3, an oxide layer 90 and contact 92 may be positioned between the N+ segments associated with the N-type wells 54. Thus, for example, the oxide layer 90 and contact 92 may be positioned between N+ segments 70 and 72 and between N+ segments 74 and 76. The oxide layer 90 and contact 92 may be connected to the P+ segments 80 and 82 and the corresponding P+ segments 80 and 82 may in turn be connected to the bases of BJTs 110, 112, 114 and 116. A parasitic capacitance 100 may be formed between the oxide layer 90 and the contact 92 in each N-type well 54 and the corresponding N+ segments (e.g., segments 70 and 72 or segments 74 and 76). A parasitic resistance 120 may also be formed between the P+ segments 80 and 82, and the N+ segment 88 that is connected to the cathode 62. Thus, a junction between the parasitic capacitance 100 and the parasitic resistance 120 may sit at the base of each of the BJTs 110, 112, 114 and 116. A collector of each of the BJTs 110, 112, 114 and 116 may be in communication with the anode 60 via the N+ segments 70, 72, 74 and 76 and an emitter of each of the BJTs 110, 112, 114 and 116 may be in communication with the cathode 62 via the N+ segment 88. Accordingly, when ESD protection is needed, the parasitic capacitance 100 and the parasitic resistance 120 may set up a voltage on the base of the BJTs 110, 112, 114 and 116 to trigger ESD protection without the use of any external circuit components to provide such triggering.

Figure 4:
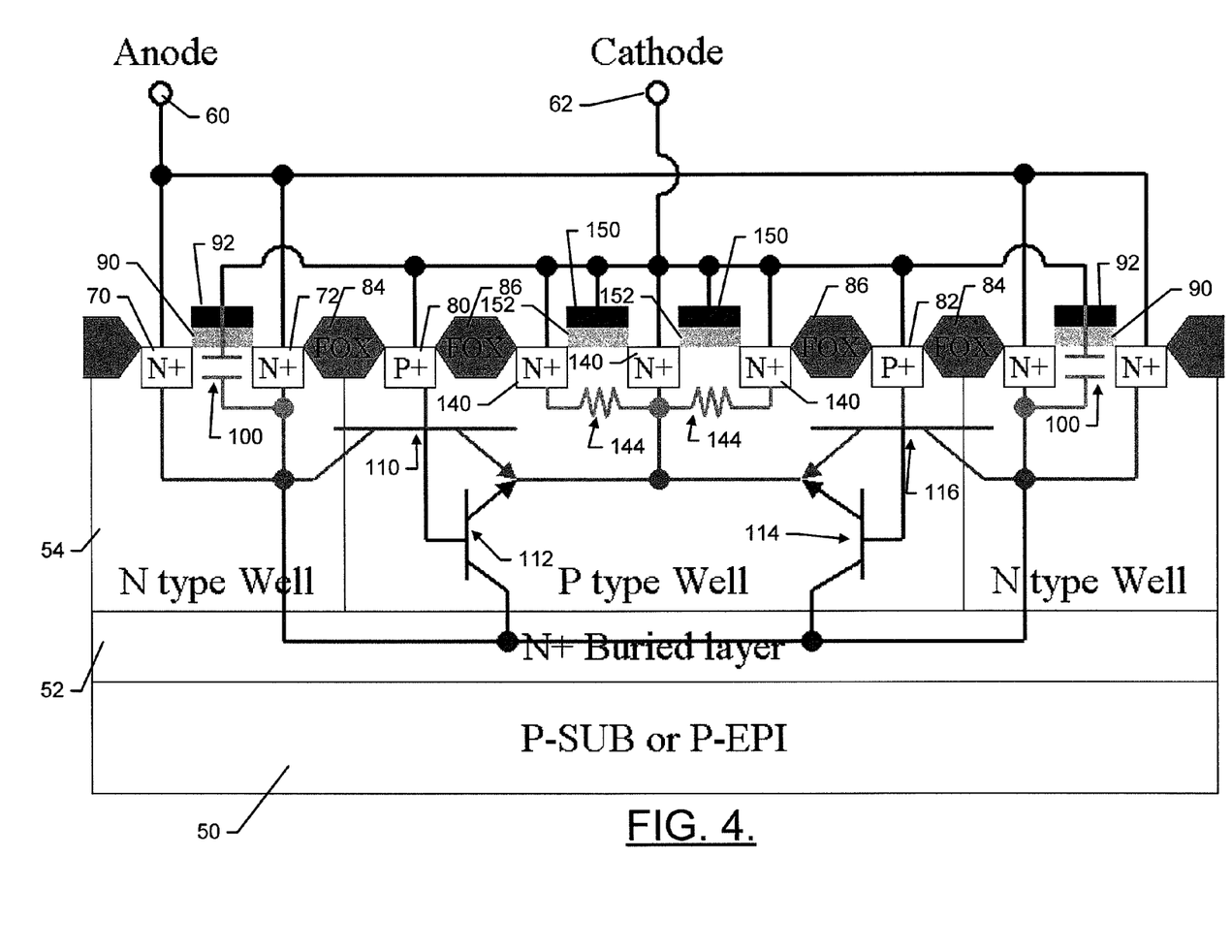
FIG. 4 illustrates a cross-sectional view of the structure of an alternative exemplary embodiment for providing high-voltage ESD protection using a self detection ESD device.

FIG. 4 illustrates a cross-sectional view of the structure of an alternative example embodiment for providing high-voltage ESD protection using a self detection ESD device. The example embodiment of FIG. 4 is similar to the example of FIG. 3 in relation to setting up ESD protection without requiring external components. Moreover, the example of FIG. 4 also resembles the structure of FIG. 3 with respect to many structural features. A few exceptions include the fact that the N+ segment 88 of FIG. 3 is split into distributed N+ segments 140 in FIG. 4. The parasitic resistance 144 of FIG. 4 is provided between respective ones of the distributed N+ segments 140 by the formation of contacts 150 and corresponding oxide films 152 positioned between each of the distributed N+ segments 140. The contacts 150 and 92 are also connected to each other and to the cathode 62 in FIG. 4. Despite these structural differences, the example of FIG. 4 also utilizes the parasitic capacitance 100 and the parasitic resistance 144 to set up a voltage on the base of the BJTs 110, 112, 114 and 116 to trigger ESD protection without the use of any external circuit components to provide such triggering.

Figure 5:
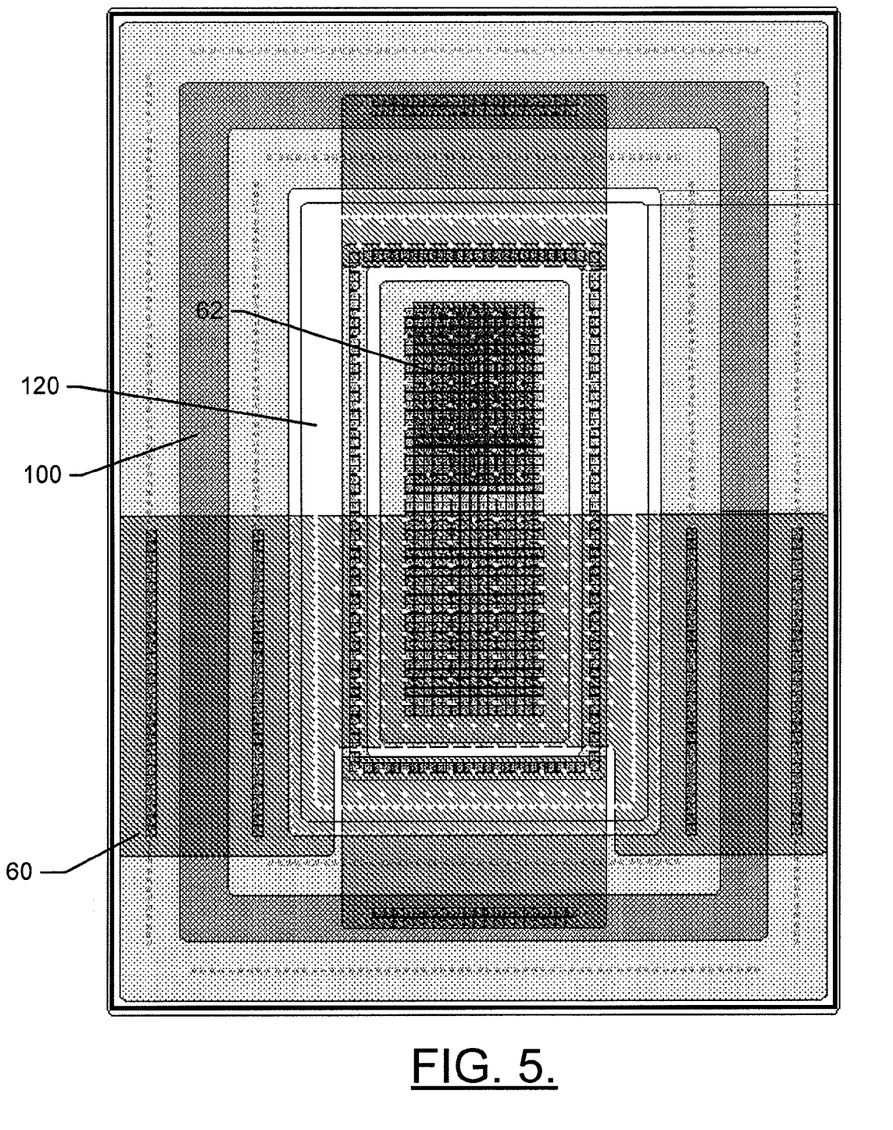
FIG. 5 illustrates a top view of an example layout for the example embodiment of FIG. 3.
Figure 6:
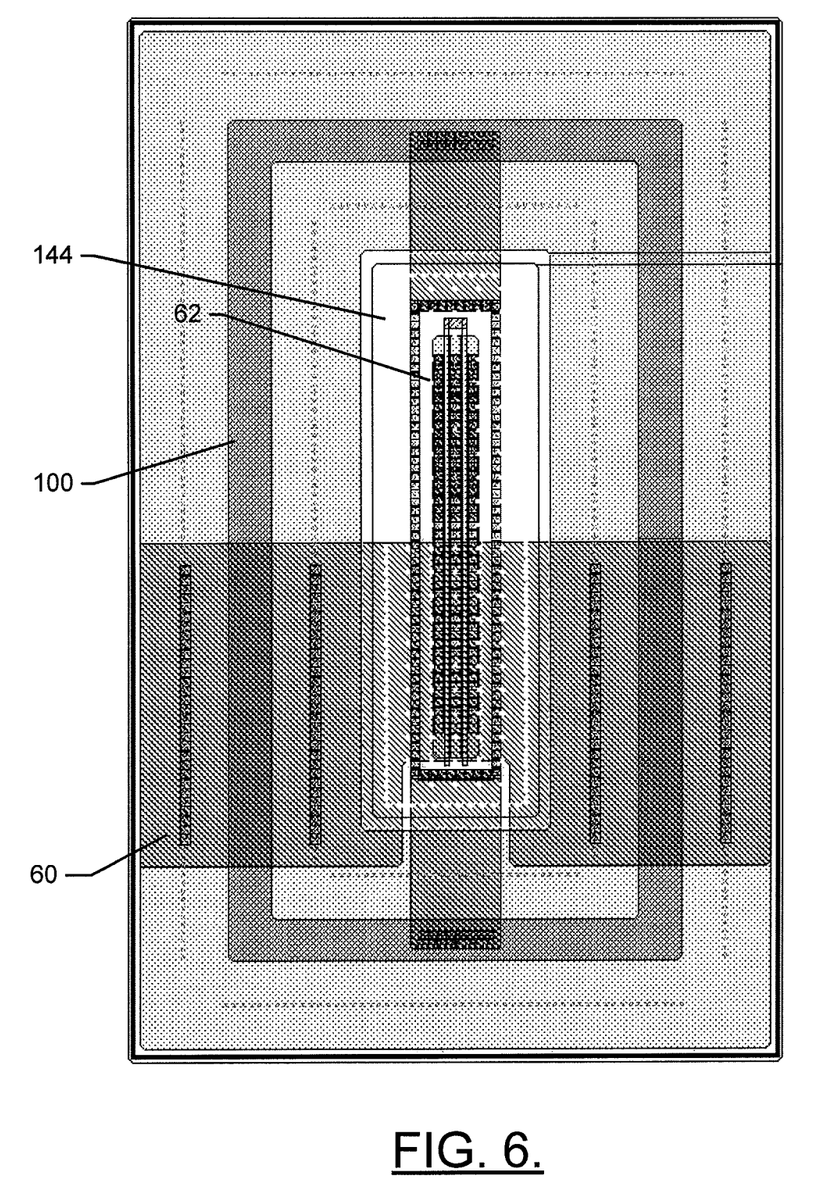
FIG. 6 illustrates a top view of an example layout for the example embodiment of FIG. 4.

FIG. 5 illustrates a top view of an example layout for the example embodiment of FIG. 3 above. Meanwhile, FIG. 6 illustrates a top view of an example layout for the example embodiment of FIG. 4 above. Each example layout provides a self detection device for high voltage ESD protection that could be applied to any process and with any operation voltage. Example embodiments can also be fabricated by a standard BCD process without the use of additional masks. In some embodiments, the N+ buried layer 52 may be removed and example embodiments can be applied at a twin well process. Some embodiments may also be applied to non-EPI processes with triple well processes, or at a single poly process.

Figure 7:
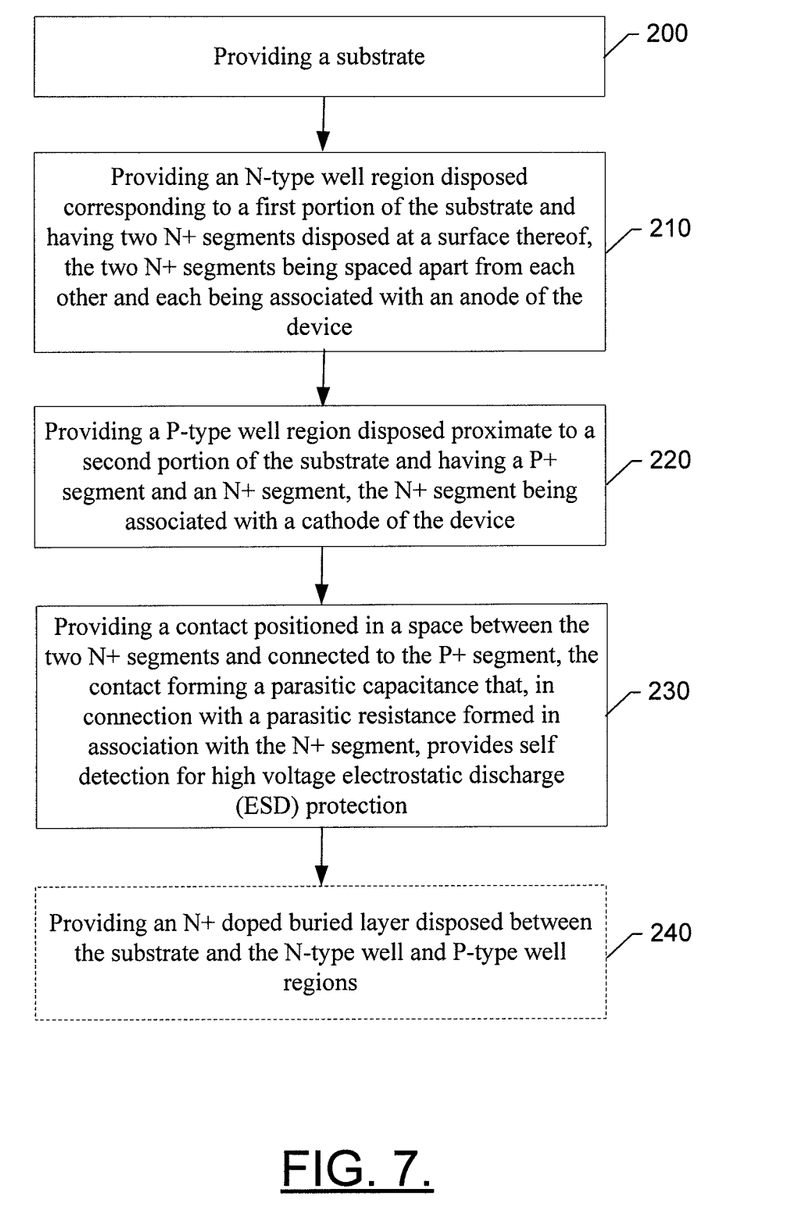
FIG. 7 illustrates a method of providing a high-voltage ESD protection device.

FIG. 7 illustrates a method of providing a high-voltage ESD protection device. As shown in FIG. 7, the method may include providing a substrate at operation 200. The method may further include providing an N-type well region disposed corresponding to a first portion of the substrate and having two N+ segments disposed at a surface thereof at operation 210. The two N+ segments may be spaced apart from each other and each being associated with an anode of the device. The method may further include providing a P-type well region disposed proximate to a second portion of the substrate and having a P+ segment and an N+ segment at operation 220. The N+ segment may be associated with a cathode of the device. In an example embodiment, the method may further include providing a contact positioned in a space between the two N+ segments and connected to the P+ segment. The contact may form a parasitic capacitance that, in connection with a parasitic resistance formed in association with the N+ segment, provides self detection for high voltage electrostatic discharge (ESD) protection in response to the occurrence of an ESD event. The method may include other optional operations in some cases (shown in dashed lines in FIG. 7). For example, in some embodiments, the method may further include providing an N+ doped buried layer disposed between the substrate and the N-type well and P-type well regions at operation 240.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An electrostatic discharge (ESD) protected device comprising:
   a substrate;
   an N-type well region disposed corresponding to a first portion of the substrate and having two N+ segments disposed at a surface thereof, the two N+ segments being spaced apart from each other and each being associated with an anode of the device; and
   a P-type well region disposed proximate to a second portion of the substrate and having a P+ segment and an N+ segment, the N+ segment being associated with a cathode of the device,
   wherein a contact is positioned in a space between the two N+ segments and connected to the P+ segment, the contact forming a parasitic capacitance that, in connection with a parasitic resistance formed in association with the N+ segment associated with the cathode, provides self detection for high voltage ESD protection.

2. The ESD protected device of claim 1, wherein the N-type well region includes two portions disposed on opposite sides of the P-type well region.

3. The ESD protected device of claim 1, further comprising an N+ doped buried layer disposed between the substrate and the N-type well and P-type well regions.

4. The ESD protected device of claim 1, wherein the parasitic resistance is formed between the N+ segment associated with the cathode and the P+ segment.

5. The ESD protected device of claim 1, wherein the N+ segment associated with the cathode is distributed into multiple N+ regions.

6. The ESD protected device of claim 5, wherein the parasitic resistance is formed between each of the multiple N+ regions of the distributed N+ segment.

7. The ESD protected device of claim 6, further comprising contacts provided in spaces between each of the multiple N+ regions corresponding to formation of the parasitic resistance.

8. The ESD protected device of claim 5, wherein the P+ segment and the contact are also associated with the cathode.

9. The ESD protected device of claim 1, wherein multiple bipolar junction transistors are formed in the device to provide the high voltage ESD protection responsive to triggering provided by the parasitic capacitance and the parasitic resistance and without external components.

10. The ESD protected device of claim 1, wherein the device is fabricated via a standard process without additional masks.

11. The ESD protected device of claim 1, wherein the substrate comprises P-type substrate material.

12. The ESD protected device of claim 1, wherein the substrate comprises epitaxially formed P-type material.

13. A method comprising:
   providing a substrate;
   providing an N-type well region disposed corresponding to a first portion of the substrate and having two N+ segments disposed at a surface thereof, the two N+ segments being spaced apart from each other and each being associated with an anode of the device;
   providing a P-type well region disposed proximate to a second portion of the substrate and having a P+ segment and an N+ segment, the N+ segment being associated with a cathode of the device; and
   providing a contact positioned in a space between the two N+ segments and connected to the P+ segment, the contact forming a parasitic capacitance that, in connection with a parasitic resistance formed in association with the N+ segment associated with the cathode, provides self detection for high voltage electrostatic discharge (ESD) protection.

14. The method of claim 13, wherein providing the N-type well region comprises providing the N-type well region including two portions disposed on opposite sides of the P-type well region.

15. The method of claim 13, further comprising providing an N+ doped buried layer disposed between the substrate and the N-type well and P-type well regions.

16. The method of claim 13, wherein the parasitic resistance is formed between the N+ segment associated with the cathode and the P+ segment.

17. The method of claim 13, wherein the N+ segment associated with the cathode is distributed into multiple N+ regions.

18. The method of claim 17, wherein the parasitic resistance is formed between each of the multiple N+ regions of the distributed N+ segment.

19. The method of claim 18, further comprising providing contacts in spaces between each of the multiple N+ regions corresponding to formation of the parasitic resistance.

20. The method of claim 13, wherein multiple bipolar junction transistors are formed in the device to provide the high voltage ESD protection responsive to triggering provided by the parasitic capacitance and the parasitic resistance and without external components.

* * * * *